United States Patent [19]

Nelson et al.

[11] Patent Number: 4,940,085
[45] Date of Patent: Jul. 10, 1990

[54] FLUID HEAT EXCHANGER FOR AN ELECTRONIC COMPONENT

[75] Inventors: Richard D. Nelson, Austin, Tex.; Omkarnath R. Gupta, Fremont, Calif.; Dennis J. Herrell, Austin; Tex.

[73] Assignee: Microelectronics and Computer Technology Corporation, Austin, Tex.

[21] Appl. No.: 441,679

[22] Filed: Nov. 27, 1989

Related U.S. Application Data

[63] Continuation-in-part of Ser. No. 251,273, Sep. 30, 1988, Pat. No. 4,909,315.

[51] Int. Cl.⁵ .............................................. H01L 23/46
[52] U.S. Cl. .................... 165/80.3; 165/185; 165/908; 361/384; 361/385
[58] Field of Search ...................... 165/185, 80.3, 908; 361/384, 385

[56] References Cited

U.S. PATENT DOCUMENTS

| | | | |
|---|---|---|---|
| 3,909,118 | 9/1975 | Schmidt | 165/908 |
| 4,561,040 | 12/1985 | Eastman et al. | 361/385 |
| 4,715,438 | 12/1987 | Gabuzda et al. | 165/185 |
| 4,783,721 | 11/1988 | Yamamoto et al. | 361/385 |

FOREIGN PATENT DOCUMENTS

| | | | |
|---|---|---|---|
| 741021 | 6/1980 | U.S.S.R. | 165/908 |
| 1356114 | 6/1974 | United Kingdom | 165/908 |

*Primary Examiner*—Albert W. Davis, Jr.
*Attorney, Agent, or Firm*—Fulbright & Jaworski

[57] ABSTRACT

A high performance fluid heat exchanger for cooling an electronic component which includes a housing having a base, a plurality of parallel fins in the housing, a center fed inlet connected to the housing opposite the base for supplying cooling fluid towards the base and toward the ends of the fins. A plate is positioned between the tops and bottoms of the fins and extends generally parallel to the base and extends towards but is spaced from the ends of the fins for providing a double cooling pass against the fins.

5 Claims, 1 Drawing Sheet

FLUID HEAT EXCHANGER FOR AN ELECTRONIC COMPONENT

CROSS-REFERENCE TO RELATED APPLICATION

This application is a continuation-in-part of application Ser. No. 07/251,273 filed Sept. 30, 1988, now U.S. Pat. No. 4,909,315 granted Mar. 20, 1990 entitled "Fluid Heat Exchanger for an Electronic Component".

BACKGROUND OF THE INVENTION

Liquid cooling heat exchangers for cooling electronic components are in use to cool high power electronic chips. Greater heat transfer and maximum power density can be provided by using finned heat exchange surfaces.

The present invention is directed to an improved high performance heat exchanger for cooling electronic components, such as chips, by providing a double fluid pass against the fins along their length. The present heat exchanger balances thermal resistance, spatial temperature variations, pressure drops, and space requirements. The present invention is particularly useful for an electronic component having even power distribution over its surface as the present heat exchanger will provide a more even temperature distribution from its base.

The present invention is directed to a center fed fluid heat exchanger for cooling an electronic component and includes a housing having a base for receiving heat from an electronic component. A plurality of spaced fins, preferably parallel to each other, each having a top, bottom, and two ends are provided with the bottoms connected to the base in which the fins are perpendicular to the base. A first fluid connection, such as a fluid inlet tube communicates with the housing opposite the base and has a longitudinal axis perpendicular to the base. The axis is directed towards the fins between the ends of the fins for transmitting a cooling fluid between the inlet tube and the fins, the base and the ends of the fins. A second fluid connection, such as a fluid outlet tube is in communication with the ends of the fins. The tops of the fins include a recess in communication with the inlet tube for supplying fluid to all of the fins. A plate is provided between the top and bottom of the fins extending generally parallel to the base and extending toward but spaced from the ends of the fins for directing the cooling fluid in a double pass relationship along the length of the fins.

Still a further object of the present invention is wherein the plate is positioned midway between the top and bottom of the fins for minimizing pressure drop.

Yet a still further object of the present invention is wherein the ends of the fins extend to the inside of the housing for maximum heat transfer.

Another object is wherein the inlet and outlet are concentric tubes.

A further object of the present invention is the provision of structural interconnections between the fins and the plate for ease of assembly and structurally connecting the parts of the heat exchanger.

Other and further objects, features and advantages will be apparent from the following description of a presently preferred embodiment of the invention, given for the purpose of disclosure, and taken in conjunction with the accompanying drawing.

DESCRIPTION OF THE PREFERRED EMBODIMENT

Figure 1:
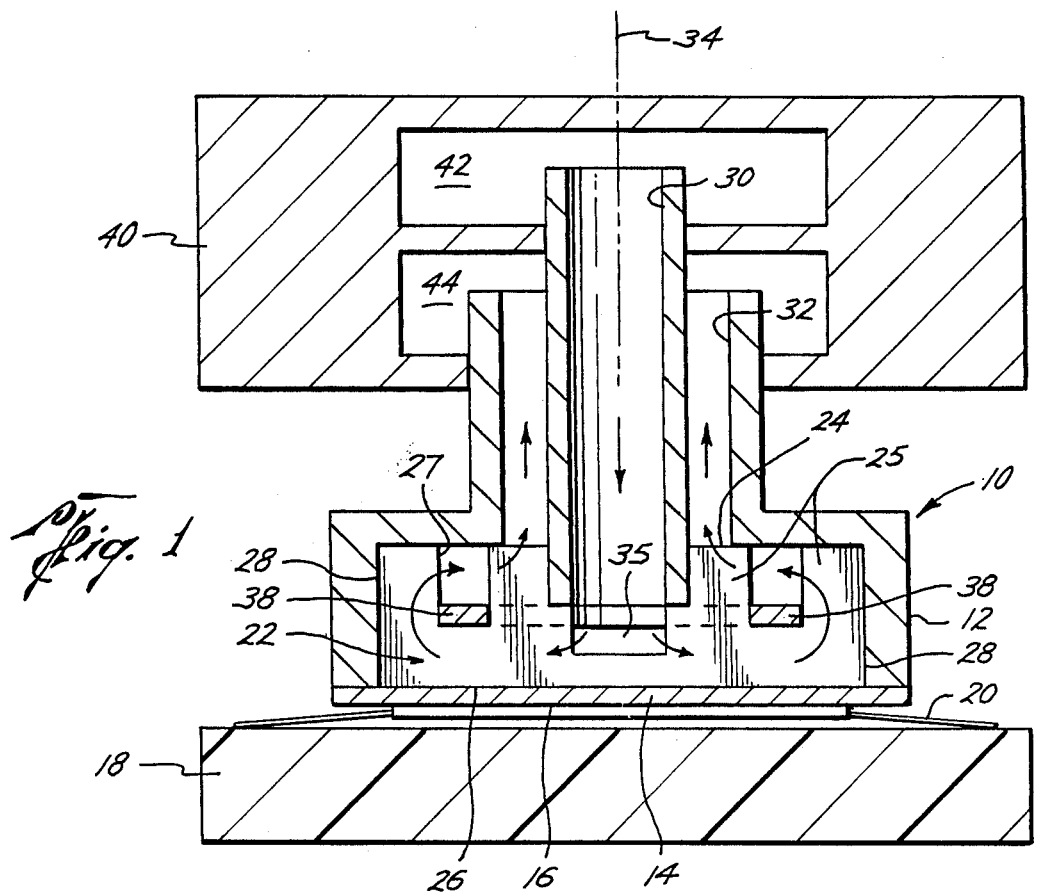
FIG. 1 is an elevational view, in cross-section, of the present invention.
Figure 2:
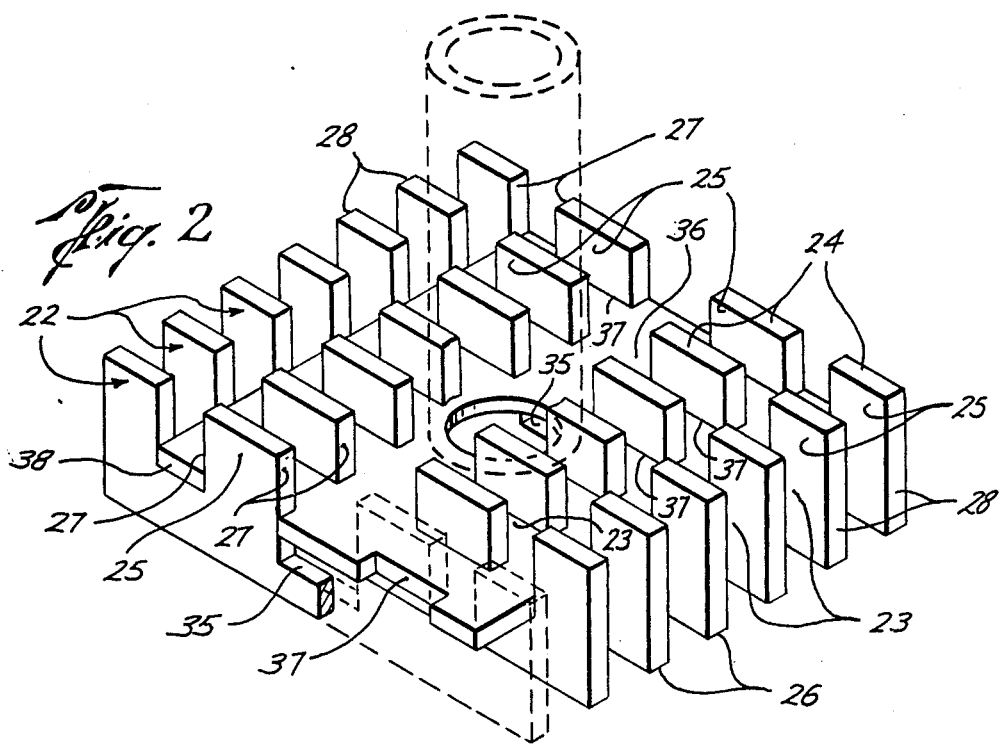
FIG. 2 is a perspective view of the finned structure inside the apparatus of FIG. 1.

Referring now to the drawing, the reference numeral 10 generally indicates the fluid heat exchanger of the present invention. While any suitable cooling fluid can be used such as a gas or liquid, the present invention will be described for the purpose of illustration only, as using water. The apparatus 10 includes a housing 12 having a base 14. The base 14 is adapted to be part of or attached to an electronic component 16, such as an electronic chip, which may be connected to a substrate 18 by suitable electrical connections 20. In any event, the base 14 is positioned relative to the chip 16 for receiving heat therefrom.

A plurality of spaced fins 22, preferably parallel to each other, are provided in the housing 12. Each of the fins 22 includes a top 24, a bottom 26 and ends 28. The bottoms 26 of the fins 22 are connected to or made integral with the base 14 and the fins 22 are positioned in planes perpendicular to the base 14. A first fluid tube such as an inlet tube 30 and a second fluid tube such as outlet tube 32, preferably concentric, are connected to the housing 12 opposite the base 14 and have a longitudinal axis 34 directed towards the fins 22 between the ends 28 of the fins 22. Thus, incoming cooling liquid flows downwardly through the inlet tube 30, preferably to the center of the base 14, and in the channels 23 between the fins 22 and is then directed to both ends 28 of the fins 22. Splitting the flow of the center fed cooling liquid results in lower pressure drops across the fins 22.

The cross-sectional area of the inlet 30 and outlet 32 tubes is less than the cross-sectional area of the base 14. In order to supply cooling fluid to the channels 23 between the fins 22 which are not directly under the outlet end of the inlet tube 30 a recess 35 is provided in the tops 24 of the fins 22 in communication with the inlet 30 for supplying cooling fluid to all of the fins 22.

A plate 36 is provided between the tops 24 and the bottoms 26 of the fins 28. The plate extends generally parallel to the base 14 and extends towards but is spaced from the ends 28 of the fins 22. The plate 36 provides for a double pass of the cooling liquid along the length of the fins 22. That is, the incoming fluid through the inlet tube 30 is directed towards the center of the heat exchanger 12, through the recess 35 to all of the channels 23 between the fins 22. The fluid then flows towards the opposite ends 28 of the fins 22 making one pass along the length along the bottoms 26 of the fins 22. The liquid then flows around the ends 38 of the plate 36. The cooling liquid then flows inwardly from the ends 28 of the fins 22 making a second pass across the portion of the fins 22 which are above the plate 36 and exits through the fluid outlet 32. Of course, if desired the direction of the fluid flow could be reversed by directing the incoming fluid through tube 32 and exiting through tube 30.

The heat exchanger 10 is particularly advantageous where there is an even power distribution over the area of the chip 16. The present invention provides a more even temperature distribution out of the base 14. That is, the cooling liquid flowing from the inlet 30 is initially cooler as it flows downwardly into the middle of the base 14, warms as it passes towards the ends 28 of the fins 22, and becomes still warmer as it makes a second pass across the top portion of the fins 22 and reaches its highest temperature nearer the center and exits through the outlet 32. This generally provides a more even heat dissipation from the base 14 by each of the fins 22.

The plate 36 is preferably positioned midway between the tops 24 and the bottoms 26 of the fins 22 for providing an even pressure drop along the path of the fluid flow.

Preferably, the ends 28 of the fins 22 extend to the inside of the housing 12 for providing a maximum fin area for heat transfer. The heat transfer at the fins 22 is a function of the width of the channels 23 between the fins 22, the thickness of the fins 22 and the height of the fins 22. In the preferred embodiment, copper fins 0.1 inches high by 0.10 to 0.020 inches thick can be used with channel spacings of 0.010 to 0.020 inches.

Preferably, the ends 28 of the fins 22 extend to and are in contact with the inside of the walls of the housing 12 for providing a maximum heat transfer from the base 14. However, if desired, the ends 28 of the fins 22 can be tapered downwardly and outwardly as described in copending U.S. patent application Ser. No. 07/251,273 for decreasing the pressure drop of the cooling liquid.

In the embodiment shown, a manifold 40 may be provided having an inlet fluid manifold 42 and an outlet fluid manifold 44 which would be particularly advantageous for a multi-chip package application. However, the inlet tube 30 and the outlet tube 32 may be attached directly to hoses or other fluid conduits.

Preferably for ease of assembly and for structurally interconnecting the fins 22 and the plate 36, the fins and plate are provided with coacting engaging parts. Thus, the fins 22 include a plurality of upwardly directed projections 25 separated by recesses 27. The plate 36 includes a plurality of spaced openings 37 for receiving the projections 25. The heat exchanger 10 can easily and quickly be assembled by inserting the projections 25 into the openings 37 thereby interconnecting the fins 22 with the plate 36 and providing structural support therebetween.

The present invention, therefore, is well adapted to carry out the objects and attain the ends and advantages mentioned as well as others inherent therein. While a presently preferred embodiment of the invention has been given for the purpose of disclosure, numerous changes in the details of construction and arrangement of parts will be readily apparent to those skilled in the art and which are encompassed within the spirit of the invention and the scope of the appended claims.

What is claimed is:

1. A fluid heat exchanger for cooling an electronic component comprising,
    a housing having a base for receiving heat from an electronic component,
    a plurality of spaced fins each having a top, bottom, and two ends, said bottoms connected to the base, and said fins being perpendicular to the base,
    a first fluid tube communicating with the housing opposite the base and having a longitudinal axis perpendicular to the base, said axis directed towards the fins between the ends of the fins for transmitting a cooling fluid between the first tube and the fins, the base and the ends of the fins, and
    a second fluid tube in communication with the fins,
    the tops of the fins including a recess in communication with the first tube for communicating fluid between all of the fins and the first tube, and
    a plate between the top and bottom of the fins extending generally parallel to the base and extending toward but spaced from the ends of the fins for directing the cooling fluid in a double pass against the fins.

2. The apparatus of claim 1 wherein the plate is positioned midway between the tops and bottoms of the fins.

3. The apparatus of claim 1 wherein the ends of the fins extend to the inside of the housing.

4. The apparatus of claim 1 wherein the first fluid tube and the second fluid tube are concentric tubes.

5. The apparatus of claim 1 wherein the top portions of each of the fins includes a plurality of upwardly directed projections separated by recesses, and
    said plate includes a plurality of spaced openings for receiving the projections of the fins for easily assembling and structurally connecting the fins to the plate.

* * * * *